United States Patent
Turner et al.

[11] Patent Number: 5,885,869
[45] Date of Patent: *Mar. 23, 1999

[54] METHOD FOR UNIFORMLY DOPING HEMISPHERICAL GRAIN POLYCRYSTALLINE SILICON

[75] Inventors: Charles Turner; Randhir P. S. Thakur, both of Boise, Id.

[73] Assignee: Micron Technology, Inc., Boise, Id.

[ * ] Notice: The term of this patent shall not extend beyond the expiration date of Pat. No. 5,208,479.

[21] Appl. No.: 528,183

[22] Filed: Sep. 14, 1995

Related U.S. Application Data

[63] Continuation of Ser. No. 71,904, Jun. 3, 1993, abandoned.

[51] Int. Cl.[6] ................................................... H01L 21/20
[52] U.S. Cl. ......................... 438/261; 438/263; 438/266; 438/269; 438/430; 438/478; 438/488; 148/DIG. 14; 148/DIG. 122; 148/DIG. 138
[58] Field of Search ................................... 437/101, 109, 437/919, 967, 977; 148/DIG. 14, DIG. 122, DIG. 138; 438/261, 263, 266, 269, 430, 478, 488

[56] References Cited

U.S. PATENT DOCUMENTS

| | | | |
|---|---|---|---|
| 5,089,867 | 2/1992 | Lee | 357/23.5 |
| 5,112,773 | 5/1992 | Tuttle | 437/919 |
| 5,192,708 | 3/1993 | Beyer et al. | 437/101 |
| 5,208,479 | 5/1993 | Mathews et al. | 257/534 |
| 5,290,729 | 3/1994 | Hayashide et al. | 437/977 |
| 5,320,880 | 6/1994 | Sandhu et al. | 427/578 |

FOREIGN PATENT DOCUMENTS

| | | |
|---|---|---|
| 0448374A1 | 9/1991 | European Pat. Off. . |
| 0521644A1 | 7/1993 | European Pat. Off. . |

OTHER PUBLICATIONS

"Low Pressure Chemical Vapor Deposition Reactors", Silicon Processing For the VLSI Era—vol. 1: Process Technology, pp. 169–171, Stanley Wolf and Richard N. Tauber.

"Rapid Thermal Processing (RTP)", Microchip Fabrication—A Practical Guide to Semiconductor Processing (Second Edition), pp. 143–145, Peter Van Zant.

"Rapid Isothermal Processing", J. Appl. Phys., vol. 63, No. 8, 15 Apr. 1988, pp. 59–114, R. Singh.

"A High Capacitor (20.4 FF/um2) with Ultrathin CVD—Ta205 Films Deposited on Rugged Poly–Si for High Density DRAMs", IEDM 1992 pp. 263 to 266, P. Fazan et al.

(List continued on next page.)

*Primary Examiner*—Robert Kunemund

[57] ABSTRACT

A method is disclosed for uniformly doping HSG polycrystalline silicon independent of the other layers of the semiconductor substrate. A semiconductor substrate having a silicon dioxide layer formed superjacent a polysilicon layer is provided in a chamber. A doped rough silicon layer is formed in situ superjacent the silicon dioxide layer. This is accomplished by depositing the silicon layer superjacent the silicon dioxide layer and exposing the silicon layer to a source gas, a dopant gas, and energy, preferably in situ to thereby form uniformly doped silicon layer and roughened polysilicon layer using rapid thermal chemical vapor deposition techniques or low pressure chemical vapor deposition.

Alternatively, a uniformly doped roughened polysilicon layer is formed superjacent the silicon dioxide layer in situ. This formation is achieved by depositing an amorphous silicon layer superjacent the silicon dioxide layer and roughening the amorphous silicon layer in situ. The step of roughening is achieved by vacuum annealing the amorphous silicon layer using rapid thermal chemical vapor deposition techniques or low pressure chemical vapor deposition. The roughened amorphous silicon layer is doped by exposing to a source gas, a dopant gas and energy.

16 Claims, 2 Drawing Sheets

OTHER PUBLICATIONS

Hirohito Watanabe et al. Device Application and Structure Observation for Hemispherical—Grained Si, Dec. 9, 1991, Journal of Applied Physics pp. 3538–3543, vol. 71 (7).

H. Watanabe et al. An Advanced Fabrication Technology of Hemispherical Grained Poly–Si for High Capacitance Storage Electrodes, 1991. Extended Abstracts of the 1991 International Conf. on Solid State Devices & Materials, Bus. Center Acad. Soc. Japan (pp. 478–480).

Mali Venkatesan et. al. Single Wafer Deposition of Poly-crystalline Silicon, Solid State State Technology Mar. 1993.

S.S. Dana et al, CVD Growth of Rough Morphology Silicon Films Over a Broad Temperature Range, IBM Research Division Appl. Phys. Lett, vol. 63 (10) pp. 1387–1389, 6 Sep. 1993.

Akira Sakai et al,Novel Seeding Method for the Growth of Polycrystalline Si Films with Hemispherical Grains, Applied Physics Letters Jul. 13, 1992 pp. 159–161, vol. 61(2).

S. Wolf et al., *Silicon Processing for the VLSI Era Vol. 1: Process Technology*, Lattice Press, Sunset Beach, CA (1986), pp. 175–177.

A. Sakai et al., "Crystallization of Amorphous Silicon with Clean Surfaces" Japanese Journal of Applied Physics vol. 30, No. 6A, Jun. 1991, pp. L941–L943.

METHOD FOR UNIFORMLY DOPING HEMISPHERICAL GRAIN POLYCRYSTALLINE SILICON

This application is a continuation of application Ser. No. 08/071,904 filed Jun. 3, 1993, now abondoned.

FIELD OF THE INVENTION

The present invention relates to a method for fabricating semiconductors, and more particularly, a method for uniform doping of hemispherical grain polycrystalline silicon.

BACKGROUND OF THE INVENTION

The continuing trend of scaling down integrated circuits has forced the semiconductor industry to consider new techniques for fabricating precise components at submicron levels. Along with the need for smaller components, there has been a growing demand for capacitors having increased capacitances and reduced feature widths.

With respect to dynamic memory devices, storage node capacitor cell plates must be sufficiently large to retain an adequate charge. This is particularly significant when taking device noise and parasitic effects into account. As density of semiconductor devices, such as DRAM arrays, has continued to increase with industry trends, the issue of maintaining storage node capacitance has grown in importance.

In light of the above demands, several techniques have been proposed to increase the capacitance of capacitors without effecting the cell area. These techniques have included utilizing trench and stacked capacitor structures, as well as new dielectric material having increased dielectric constants.

Another approach for increasing capacitance while reducing feature size known in the art is discussed in U.S. Pat. No. 5,208,479. The method involves employing roughened polycrystalline silicon ("polysilicon") film, such as Hemi-Spherical Grain ("HSG") polysilicon, as a capacitor storage node. Fundamentally, by relying on roughened polysilicon, a larger surface area is formed for the same planar area that is available for the capacitor.

Given the advantages of roughened polysilicon, a storage node of a cell capacitor is typically formed by initially providing a doped polysilicon layer of approximately 800ÅA. Subsequently, the surface of the doped polysilicon layer is cleaned. Once cleaned, a roughened polysilicon layer of approximately 600ÅA is deposited superjacent the doped polysilicon layer. Upon depositing, the roughened polysilicon layer is doped using a high temperature dopant drive technique. The drive technique in doping the roughened polysilicon layer relies on driving dopant from the previously doped polysilicon layer upwards into to the roughened polysilicon layer.

However, the approach of upwardly drive doping has several shortcomings. One particular failing is the lack of uniformity in doping the roughened polysilicon. Referring to FIG. 1, a storage node is illustrated employing a roughened polysilicon layer 30, such as HSG, having non-uniform doping characteristics. A semiconductor substrate 10 is shown comprising a silicon dioxide layer 20 superjacent a polysilicon layer 15. While polysilicon layer 15 is downwardly drive doped, the same dopant is utilized to upwardly drive dope roughened polysilicon layer 30. It is this approach that ultimately causes a series of malformed regions 35 in layer 15. Ultimately, regions 35 effect the reliability and performance of storage node.

Referring to FIG. 2, a completed cell capacitor utilizing HSG technology is depicted having two defect regions 35' and 35". The capacitor comprises top and bottom electrodes, 40 and 45, and a dielectric layer 50 comprising Barium Strontium Titanate ("BST"), Oxide-Nitride-Oxide ("ONO") or Oxide-NitrideOxide-Nitride ("ONON") for example. Upon completion of the capacitor, regions 35' and 35" are formed. Regions 35' and 35"'' develop during the step of etching access areas to create contacts to both storage nodes of the intended capacitor. The formation of regions 35' and 35" can be primarily attributed to the roughness of the surface associated with layer 30, as well as the lack of uniformity in doping layer 30. The lack of uniformity in doping contributes to regions 35' and 35", in part because the etching rates vary depending on the dopant concentration. FIG. 3 illustrates this point in a graph showing Dopant Concentration versus Thickness characteristics as they relate to etching rates, C1 and C2.

As such, there is a need for a method for doping the top roughened polysilicon layer independently from the doping of a the bottom polysilicon layer. In this light, there is a demand for a method which enables more uniform doping of the top roughened polysilicon layer and bottom polysilicon layer.

SUMMARY OF THE INVENTION

The primary advantage of the present invention is to eliminate the aforementioned drawbacks of the prior art.

A further advantage of the present invention is to provide a method for fabricating semiconductors which facilitates the doping of a top roughened polysilicon layer independently from the doping of a bottom polysilicon layer.

Yet another advantage of the present invention is to provide a method which enables more uniform doping of a top roughened polysilicon layer and bottom polysilicon layer.

Other advantages will become apparent to those skilled in the art from the following detailed description read in conjunction with the appended claims and the drawings attached hereto.

In order to achieve the hereinabove objects, as well as others which will become apparent hereafter, a method is disclosed for uniformly doping HSG polycrystalline silicon independent of the other layers of the semiconductor substrate. Initially, a semiconductor substrate having a silicon dioxide layer formed superjacent a polysilicon layer is provided, preferably in a chamber. Subsequently, a doped rough silicon layer is formed in situ superjacent the silicon dioxide layer. This is accomplished by depositing the a silicon layer superjacent the silicon dioxide layer and exposing the silicon layer to a source gas, such as silane ($SiH_4$), disilane, trisilane, or dichlorosilane, and a dopant gas, such as phosphine ($PH_3$), arsine, borane, diborane, or triborane, and energy, preferably in situ to thereby form uniformly doped silicon layer and roughened polysilicon layer. In order to achieve the optimum performance, the energy must generate a temperature of at least 550° C. for at least 10 seconds should rapid thermal chemical vapor deposition techniques be utilized. In the event low pressure chemical vapor deposition is employed, the extent of exposure to 550° C. will be approximately 30 minutes. Thus, the energy required can be generated by either a furnace or a rapid thermal processing lamp.

In a second embodiment of the present invention, a semiconductor substrate having a silicon dioxide layer superjacent a first polysilicon layer is initially provided, preferably in a chamber. Subsequently, a uniformly doped roughened polysilicon layer is formed superjacent the silicon dioxide layer in situ. This formation is achieved by depositing an amorphous silicon layer superjacent the silicon dioxide layer and roughening the amorphous silicon layer in situ. The step of roughening is achieved by vacuum annealing the amorphous silicon layer at a pressure of $10^{-8}$ Torr, a temperature of at least 550° C. for at least 10 seconds should rapid thermal chemical vapor deposition techniques be utilized. In the event low pressure chemical vapor deposition is employed, the extent of exposure to 550° C. will be approximately 30 minutes. Finally, the roughened amorphous silicon layer is doped by exposing to a source gas, such as silane ($SiH_4$), disilane, trisilane, or dichlorosilane, and a dopant gas, such as phosphine ($PH_3$), arsine, borane, diborane, or triborane, and energy. In order to achieve the optimum performance, the energy must generate a temperature of at least 550° C. for at least 10 seconds should rapid thermal chemical vapor deposition techniques be utilized. In the event low pressure chemical vapor deposition is employed, the extent of exposure to 550° C. will be approximately 30 minutes. Nonetheless, the energy can be generated by either a furnace or a rapid thermal processing lamp.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but merely representations not intended to portray the specific parameters or the structural details of the invention, which can be determined by one of ordinary skill in the art by examination of the information herein.

DETAILED DESCRIPTION OF THE INVENTION

Figure 1:
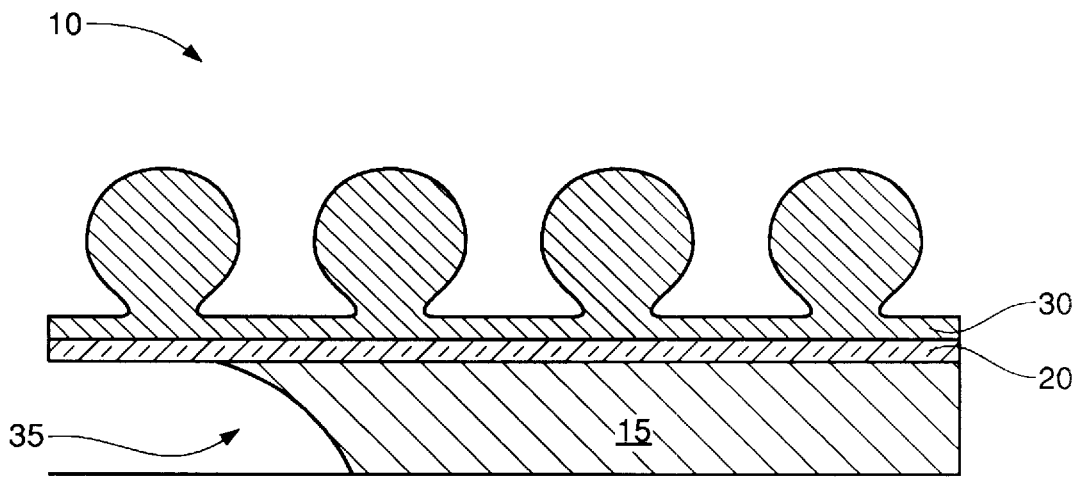
FIG. 1 is a cross-sectional perspective of a doped hemispherical grain polysilicon disposed upon a silicon dioxide layer, which is disposed upon a non-uniformly doped silicon layer.
Figure 2:
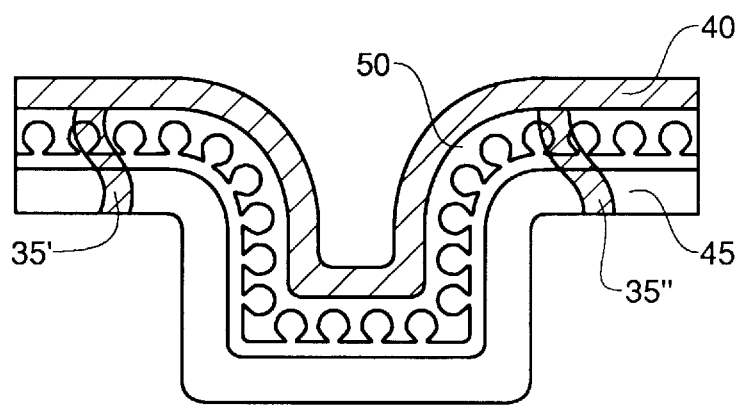
FIG. 2 is a completed cell capacitor utilizing HSG technology having two defect regions.
Figure 3:
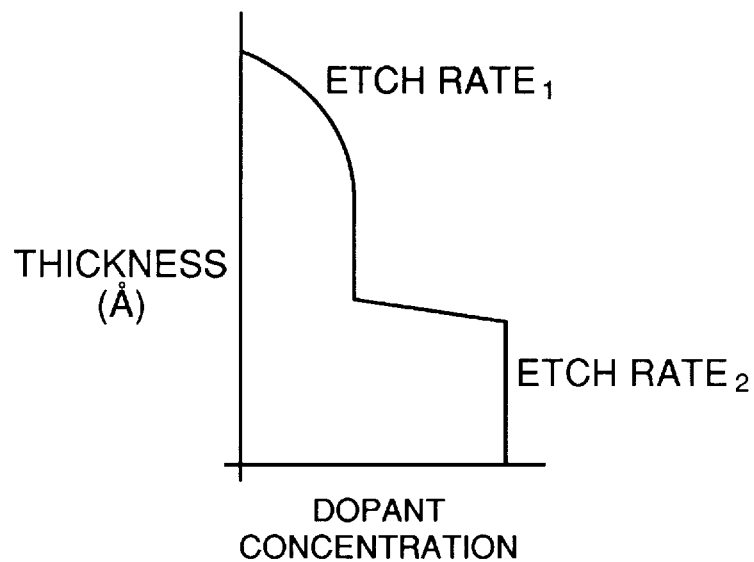
FIG. 3 is a graph illustrating Dopant Concentration versus Thickness.
Figure 4:
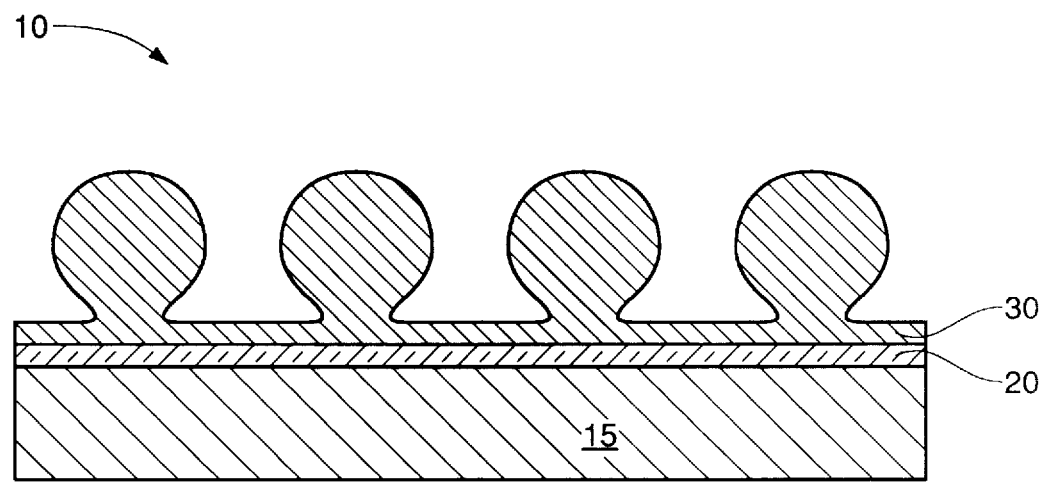
FIG. 4 is a cross-sectional perspective of a doped hemispherical grain polysilicon layer having undergone the present invention.

Referring to FIG. 4, a doped hemispherical grain polycrystalline silicon ("polysilicon") layer is illustrated having undergone the present invention. According to present inventive method, a semiconductor substrate 10 is initially provided, preferably in a chamber. Thus, by performing the present inventive method in a chamber in situ, the likelihood of the resultant semiconductor being contaminated is substantially reduced.

Substrate 10 comprises a semiconductor layer 15, which has been already doped, and a silicon dioxide layer 20 superjacent semiconductor layer 15. In the preferred embodiment of the present invention, semiconductor layer comprises polysilicon layer. Additionally, it should be noted that while the present method can be performed ex situ, in the preferred embodiment, upon providing substrate 10 in a chamber (not shown), the remaining steps are performed in situ.

Upon providing substrate 10, a doped rough silicon layer 30 is subsequently formed superjacent substrate 10. In the preferred embodiment of the present invention, doped rough silicon layer 30 comprises hemispherical grain ("HSG") polysilicon and is formed superjacent silicon dioxide layer 20.

The step of forming doped rough silicon layer 30 is accomplished by depositing rough silicon layer 30 superjacent substrate 10, and more particularly silicon dioxide layer 20, and doping rough silicon layer 30 by exposing it to a gas and energy. In the preferred embodiment, both depositing and exposing are performed simultaneously by means of rapid thermal chemical vapor deposition ("RTCVD"). Nonetheless, low pressure chemical vapor deposition ("LPCVD") can also be employed, though RTCVD is a faster technique.

With respect to exposing rough silicon layer 30 to a gas and energy, in the preferred embodiment, the gas used comprises both a source gas and a dopant gas. The source gas comprises silane ($SiH_4$), disilane, trisilane, or dichlorosilane, though other gases known to one of ordinary skill in the art may be used in the alternative. Further, the dopant gas comprises phosphine ($PH_3$), arsine, borane, diborane, or triborane, though other gases known to one of ordinary skill in the art may also be used alternatively.

Moreover, a requisite energy level is needed to dope rough silicon layer 30. Ultimately, the energy employed must generate a temperature of at least 550° C. for at least 10 seconds should rapid thermal chemical vapor deposition techniques be utilized. In the event low pressure chemical vapor deposition is employed, the extent of exposure to 550° C. will be approximately 30 minutes. The energy required can be generated by several means, including a furnace or rapid thermal processing lamps.

In a second embodiment of the present invention, the step of forming a doped rough silicon layer involves depositing an amorphous silicon layer (not shown) and roughening the amorphous silicon layer. The process of roughening is accomplished by vacuum annealing the amorphous silicon layer in situ. The step of vacuum annealing is performed at a temperature of at least 550° C. at a pressure of $10^{-8}$ Torr, for at least 10 seconds should rapid thermal chemical vapor deposition techniques be utilized. In the event low pressure chemical vapor deposition is employed, the extent of exposure to 550° C. will be approximately 30 minutes. Once roughened, the layer is then doped by exposing it to energy and a gas. As described above, the gas comprises a source gas, such as silane ($SiH_4$), disilane, trisilane, or dichlorosilane, and a dopant gas, such as phosphine ($PH_3$), arsine, borane, diborane, or triborane. In order to achieve the optimum performance, the energy must generate a temperature of at least 550° C. for at least 10 seconds should rapid thermal chemical vapor deposition techniques be utilized. In the event low pressure chemical vapor deposition is employed, the extent of exposure to 550° C. will be approximately 30 minutes. Nonetheless, the energy can be generated by either a furnace or a rapid thermal processing lamp.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method for fabricating semiconductor wafers, comprising the steps of:
    providing a semiconductor substrate, said substrate comprises a doped polysilicon layer having a silicon dioxide layer disposed thereon; and
    depositing a doped rough silicon layer directly upon said substrate by RTCVD at a temperature of at least 550° C.

2. A method for fabricating semiconductor wafers, according to claim 1, wherein said depositing comprises the steps of:
    depositing a silicon layer superjacent said substrate; and
    exposing said silicon layer to gas and energy, thereby forming a doped silicon layer.

3. A method for fabricating semiconductor wafers, according to claim 1 wherein said depositing comprises the steps of:
    depositing a silicon layer directly upon said substrate while exposing said silicon layer to gas and energy.

4. A method for fabricating semiconductor wafers, according to claim 2, wherein said silicon layer comprises hemispherical grain polysilicon.

5. A method for fabricating semiconductor wafers, according to claim 3, wherein said gas comprises a source gas and a dopant gas.

6. A method for fabricating semiconductor wafers, according to claim 5, wherein said method is performed in situ, thereby reducing contamination.

7. A method for uniformly doping hemispherical grain polycrystalline silicon, comprising the steps of:
    providing a semiconductor substrate in a chamber, said substrate comprising a silicon dioxide layer superjacent a first polysilicon layer; and
    forming a doped rough second polysilicon layer directly upon said dioxide layer by simultaneous deposition and doping by RTCVD using energy and gas, wherein said energy generates a temperature of at least 550° C.

8. A method for uniformly doping hemispherical grain polycrystalline silicon, according to claim 7, wherein said gas comprises at least one of silane(SiH$_4$), disilane, trisilane, and dichlorosilane.

9. A method for uniformly doping hemispherical grain polycrystalline silicon, according to claim 8, wherein said gas comprises a source gas and dopant gas, said dopant gas comprising at least one of phosphine (PH$_3$), arsine, borane, diborane, and triborane.

10. A method for uniformly doping hemispherical grain polycrystalline silicon, according to claim 9, wherein said second polysilicon layer comprises hemispherical grain polysilicon.

11. A method for uniformly doping hemispherical grain polycrystalline silicon, according to claim 10, wherein said first polysilicon layer is doped polysilicon.

12. A method for uniformly doping hemispherical grain polycrystalline silicon, according to claim 11, wherein said method is performed in situ.

13. A method for uniformly doping hemishperical grain polycrystalline silicon, comprising the steps of:
    providing a semiconductor substrate in a chamber, said substrate comprising a first polysilicon layer and a silicon dioxide layer disposed thereon;
    depositing an amorphous silicon layer directly upon said silicon dioxide layer in situ;
    roughening said amorphous silicon layer by vacuum annealing, wherein said roughening is performed at $10^{-8}$ Torr, and said energy generates a temperature of at least 550° C. and
    doping said roughened amorphous silicon layer by exposing said roughened amorphous silicon layer to energy and gas by RTCVD.

14. A method for uniformly doping hemispherical grain polycrystalline silicon, according to claim 13, wherein said gas further comprises at least one of silane (SiH$_4$), disilane, trisilane, and dichlorosilane.

15. A method for uniformly doping hemispherical grain polycrystalline silicon, according to claim 14, wherein said gas further comprises at least one of phosphine (PH$_3$), arsine, borane, diborane, and triborane.

16. A method for forming a capacitor structure, comprising:
    providing a substrate having a doped polysilicon layer disposed thereon;
    depositing an insulator above said doped polysilicon layer; and
    simultaneously depositing and doping another polysilicon layer on said insulator by exposing said substrate to energy and gas at a temperature of at least 555° C. and a pressure of $10^{-8}$ Torr by RTPCVD.

* * * * *